United States Patent [19]

Trapani et al.

[11] 3,721,837

[45] March 20, 1973

[54] TUNNEL DIODE SUPPLY VOLTAGE CONTROL

[75] Inventors: Richard G. Trapani, Berwyn; Benjamin Rolnick, Philadelphia, both of Pa.

[73] Assignee: General Electric Company, New York, N.Y.

[22] Filed: July 6, 1971

[21] Appl. No.: 159,662

[52] U.S. Cl. ....................307/286, 307/258, 307/323

[51] Int. Cl. ..............................................H03k 17/00

[58] Field of Search...............307/254, 258, 286, 322

[56] References Cited

UNITED STATES PATENTS

| | | | |
|---|---|---|---|
| 3,612,910 | 10/1971 | Cowan et al. | 307/258 X |
| 3,277,319 | 10/1966 | Stevens, Jr. | 307/286 X |
| 3,215,948 | 11/1965 | Dalton | 307/286 X |
| 3,339,088 | 8/1967 | Dillard | 307/286 X |

*Primary Examiner*—Stanley D. Miller, Jr.
*Assistant Examiner*—B. P. Davis
*Attorney*—Allen E. Amgott et al.

[57] ABSTRACT

Supply or biasing voltage is applied to tunnel diode through long-time-constant supply circuit from source voltage higher than turn-on value at which diode displays negative resistance. Output pulse which results when bias approaches turn-on voltage, at which diode shows negative resistance, triggers monostable circuit which loads supply circuit (e.g., by discharging capacitor of RC circuit) for predetermined period, reducing bias on diode by finite amount. Second monostable circuit, of longer output duration, temporarily reduces bias on diode below turn-off potential at which diode resumes positive resistance in order that diode may operate just below turn-on voltage, well above turn-off voltage.

1 Claim, 4 Drawing Figures

INVENTORS:
RICHARD G. TRAPANI,
BENJAMIN ROLNICK,
BY
AGENT

INVENTORS:
RICHARD G. TRAPANI,
BENJAMIN ROLNICK,
BY Henry W. Kaufmann
AGENT

TUNNEL DIODE SUPPLY VOLTAGE CONTROL

BACKGROUND OF THE INVENTION

1. Field of the Invention

This invention pertains to negative-resistance amplifiers, and more particularly to tunnel-diode amplifiers.

2. Description of the Prior Art

The tunnel diode circuit used as an amplifier may be simply represented, to a first approximation, by a constant-current signal feeding source, diode, and load conductances in parallel. (e.g., J. O. Scanlan, Analysis & Synthesis of Tunnel Diode circuits, John Wiley & Sons, 1966, FIG. 3.3 at page 77) The gain under these conditions is $4\, g_s\, g_l/(g_s + g_l + g_d)^2$ where the subscripts $s$, $l$, and $d$ refer to source, load, and diode, respectively, and the diode conductance is positive when its input current flows in the same sense as the potential applied to it. By biasing the diode so that its variational conductance becomes negative, arbitrarily large gains may be obtained so long as $(g_s + g_l + g_d)$ remains finite and positive. But, as FIG. 1 shows, increasing the voltage applied to a tunnel diode will cause the absolute magnitude of negative input conductance to increase, so that a strong input signal can cause the denominator of the expression for gain to pass through zero, and the diode will begin to oscillate. The simplest method of assuring that this does not occur is to operate the diode at such a point that the greatest incoming signal expected will not push it to such a point that it oscillates. This is done at the expense of gain.

A roughly analogous situation existed half a century ago in the adjustment of regenerative receivers; it was always necessary to keep regeneration well below the point at which spilling over into oscillation occurred, with a sacrifice of the much higher gain that could be obtained transiently near the spill-over point.

SUMMARY OF THE INVENTION

Tunnel diodes are of particular utility because they may be very small, operating at low power levels, and high speeds; but they have the characteristic of all two-terminal negative-resistance devices of having a turn-on potential at which they manifest negative dynamic resistance which becomes lower with increasing voltage, and a turn-off potential, lower than the turn-on potential, to or below which they must be reduced in order that they may resume positive resistance. FIG. 1 indicates the current-voltage relation typical of such a diode, and the preferred operating point slightly to the left of the current maximum. An incoming pulse will move the operating point to the right into a region of slope downward to the right — i.e., of negative resistance (or conductance). If the operating point is too far to the right, that is, if the bias voltage is too high, the diode may be biased into a negative resistance region such that it will tend to oscillate or, if the circuit parameters have been chosen so that oscillation is not possible, it will move down the negative slope and up the farther upward sloping continuation of the curve to a point determined by the circuit and diode characteristics. To force it back to the original operation point, the potential must be reduced to the turn-off value indicated by the dashed line with arrows, pointing to the left of FIG. 1, and then raised to the value for the preferred operating point.

We provide a long-time-constant supply circuit, most conveniently a resistor terminated by a capacitor shunted across its output, which is supplied by a potential higher than the turn-on potential of the diode, so that the bias applied to the tunnel diode slowly increases to the point at which the diode generates an output pulse. This pulse is used to trigger a monostable circuit which for a brief period turns on a drain circuit which drains some charge from the supply-circuit capacitor so that the bias on the tunnel diode is reduced. A second monostable circuit of longer pulse duration is triggered (conveniently, from the turning on of the first monostable circuit) and for the duration of its pulse it reduces the bias on the tunnel diode below its turn-off potential. When the pulse from the second monostable circuit ceases, the tunnel diode receives a bias as reduced by the operation of the drain circuit. This will be safely below but close to the turn-on potential, at an operating point giving high gain.

It is evident that the mode of operation described will necessarily produce a certain number of output pulses by the automatic increase of bias potential. Such automatically generated meaningless or noise pulses may be made infrequent relative to the desired signals by suitable design of the supply circuit. If the tunnel diode is being used to amplify the output e.g., of a radiation particle counter which has a certain background counting rate which must be deducted from an observed rate to find the significant counting rate, the additional pulses produced by our procedure merely alter the background rate to be deducted. If the amplifier is used to amplify cyclically available signals, there being a period in the cycle when no significant signal can be received, the operation of the bias control may be restricted to the no-signal period in order that any disturbances produced by it will not occur during a possible signal; this will, of course, not ordinarily prevent an occasional false signal through turn-on of the tunnel diode by excessive bias. It is also possible to compress the bias creep upward to turn-on, and the subsequent reduction, within a restricted portion of a time cycle by shunting the series resistor of the bias supply with a time-controlled conductance so that the bias will surely rise within the restricted portion of the cycle to turn-on, and then be reduced safely below turn-on value, the time-controlled conductance being reduced as soon as turn-on value of bias has been reached. The output pulses produced by this turning on can, of course, be gated out of the output utilized. This last method will automatically reset the bias potential applied to the tunnel diode once a cycle, and (assuming the cycle is of duration short compared with the time required for appreciable changes in the circuitry or the diode characteristics) will automatically keep the diode bias at optimum value during periods of possible significant signal arrival.

DESCRIPTION OF THE PREFERRED EMBODIMENTS

Figure 1:
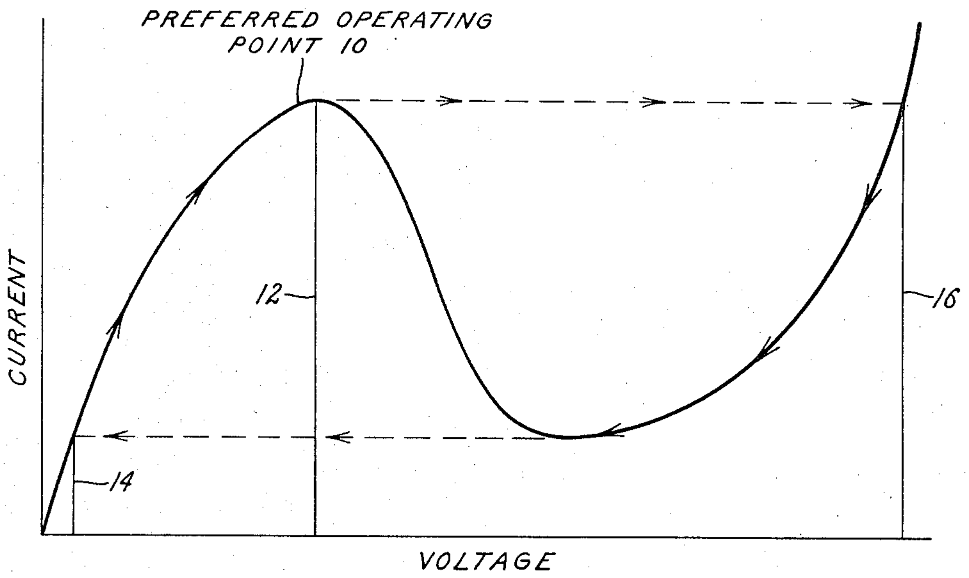
FIG. 1 represents the voltage-current characteristic typical of a tunnel diode.

FIG. 1 represents a typical voltage-current characteristic of a tunnel diode (and, indeed of many two-terminal devices manifesting negative resistance). A preferred operating point 10 is marked, slightly to the left (or lower-voltage) side of the current maximum indicated by a vertical line 12, at which the resistance is zero and becoming negative with increase in voltage. As is well known, if the circuit characteristics permit, if the voltage is increased beyond the turn-on value, the current will fall as the voltage increases, and the current will tend to return to the value it has at the turn-on voltage, but at the higher voltage indicated by vertical line 16. Once this has occurred, if the diode is to be returned to its preferred operating point 10, the voltage must be reduced to that marked by vertical line 14, and then may be raised to that corresponding to point 10, line 14 marking the turn-off voltage. The arrow heads on the solid and dashed curves indicate the effective path which is traversed in the cycle described.

Figure 2:
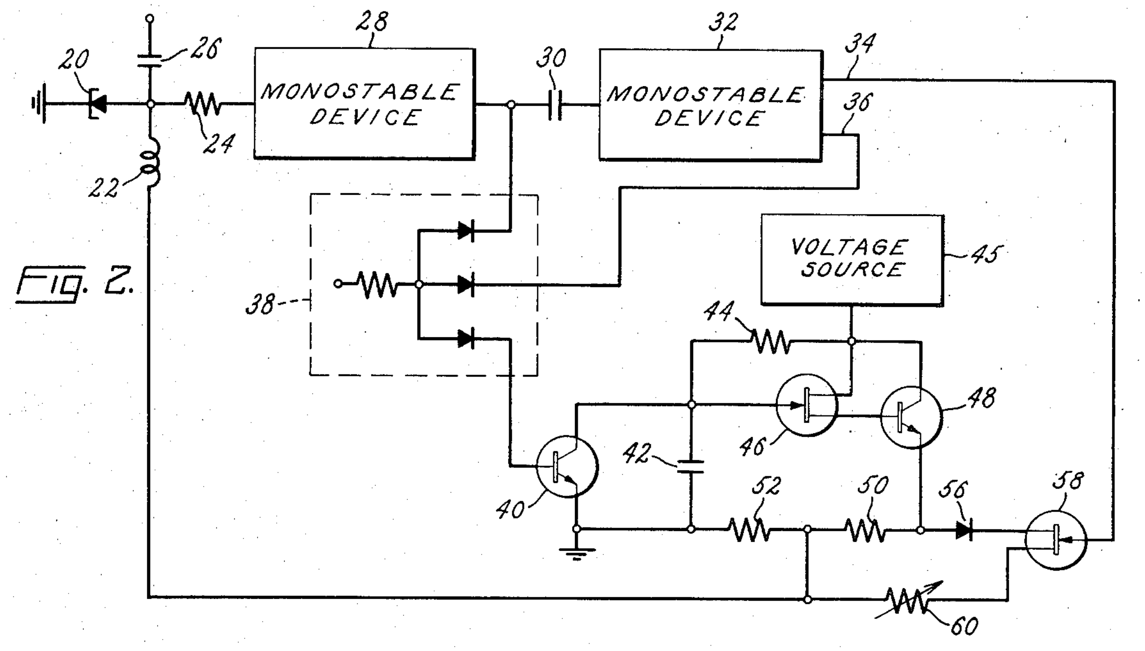
FIG. 2 represents schematically a circuit diagram embodying our invention for signals of known minimum separation in time.

FIG. 2 represents a tunnel diode 20 with one terminal at ground, and the other connected to an inductor 22 for applying bias voltage, a resistor 24 for conveying signal pulses appearing across diode 20, and a coupling capacitor 26 for feeding input signals to the diode 20. (A typical signal source for use with this device is a charge multiplying semiconductor particle detector of the kind described in U.S. Pat. No. 3,293,435, to which reference is made for further information.) Resistor 24 is connected to the input of a first monostable device 28 which, when triggered by an input pulse from diode 20, produces an output pulse for a first time duration determined by its circuit constants, and through coupling capacitor 30 is connected to a second monostable device 32. Device 32 normally (i.e., in its stable condition) produces an output at terminal 34, but when it is triggered by the trailing edge of the pulse from device 28, it produces an output at terminal 36 for a second time duration greater than the first time duration of device 28. In the application actually served, the second time duration is slightly less than the known period between successive possible significant signals. If two signals arrive within less than that known period, it will signify that one of them is a noise or otherwise parasitic pulse, and that therefore the bias on diode 20 ought to be reduced. The situation described implies that device 32 is still "on," i.e., producing an output at terminal 36 after having been triggered on by the turning off of device 28, but that a new arriving pulse has triggered device 28 so that both inputs to positive-going gate 38 will be driven, and transistor 40 will be made conducting, partially shorting capacitor 42. Capacitor 42 serves as a charge storage device, charged with a long time constant by resistor 44 from a potential source 45, higher than the turn-on potential of diode 20. The charge-dependent potential of capacitor 42 is applied via a potential follower combination of field-effect transistor (FET) 46 and transistor 48 to a potential divider composed of resistors 50 and 52, with the drop across 52 being fed to inductor 22 as bias to diode 20. The apparatus thus far described will, whenever two successive signals arrive within such a time period that one of them must be nonsignificant or spurious (noise or background), turn on transistor 40 for the duration of the pulse from device 28 (which, in an actual case, was 3 microseconds), and partially discharge capacitor 42 whose terminal potential (or a fraction thereof determined by the divider ratio) is applied to diode 20 as a bias.

Figure 3:
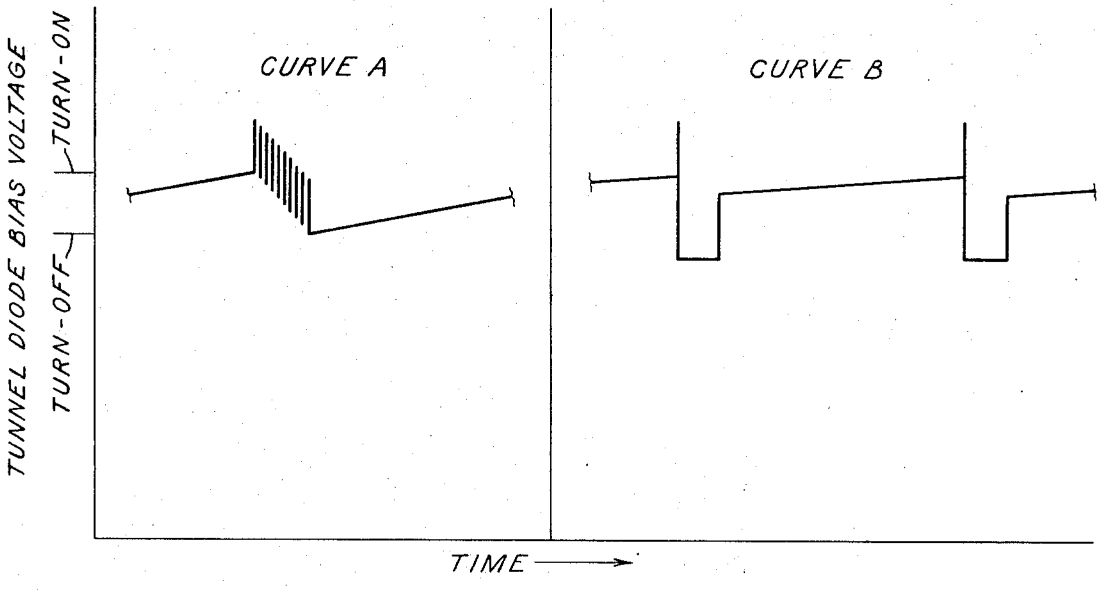
FIG. 3 represents comparison between the behavior of our invention with and without the operation of a "-turn-off" feature.

FIG. 3, curve A shows the relaxation oscillations which may occur under these conditions as the potential applied to bias diode 20, while it falls, is not reduced to the turn-off value, and consequently the diode 20 produces another pulse as soon as device 28 returns to its stable state, opening gate 38. If these successive oscillations are counted as output pulses, they may make rather objectionably large contributions to the background rate. Therefore a diode 56 is used to tie FET 58 and resistor 60 in series, as a shunt across resistor 50. Terminal 34 of device 32 is tied to control FET 58. When device 32 is in its stable state, FET 58 will be turned on by a signal from terminal 34, and resistor 50 will be effectively shunted by the series combination of diode 56, FET 58, and resistor 60. This will cause the potential drop across resistor 52 to rise, and so insure that the normal bias applied to tunnel diode 20 will be relatively high. But when monostable device 32 is triggered from its stable state, no signal will appear on terminal 34, and FET 58 will be turned off, opening the shunt path around resistor 50, and causing the drop across resistor 52 and consequently the bias on tunnel diode 20 to decrease to a value below the turn-off potential. During this time of reduced bias the charge on capacitor 42 may be undergoing reduction as previously described. The net effect of this is represented by FIG. 3, curve B, showing how the succession of relaxation oscillations is replaced by a single pulse.

Since the reduction in bias potential produced when device 32 is triggered will usually be a comparatively small fraction of total time, the reduction may be regarded as a pulse.

Recapitulating the description in general terms, there have been described a source of potential (45) higher than the turn-on potential of diode 20, connected to a potential dropping means 44, which is connected to charge storage means (42) whose terminal voltage is an increasing function of stored charge. This latter (42) is connected to apply a potential determined by its own terminal potential as a bias to diode (20) (the connection described being by items 46, 48, 50, 52, 56, 58, and 60). Transistor 40 is a controllable drain means connected to drain charge from 42, and gate 38 is a gain control signal generating means. FET 58 and monostable device 32 act as turn-off means for producing the potential pulse described above which, during the existence of the drain control signal, reduces the bias applied to diode 20 by an amount sufficient to make it less than the turn-off value for diode 20.

Figure 4:
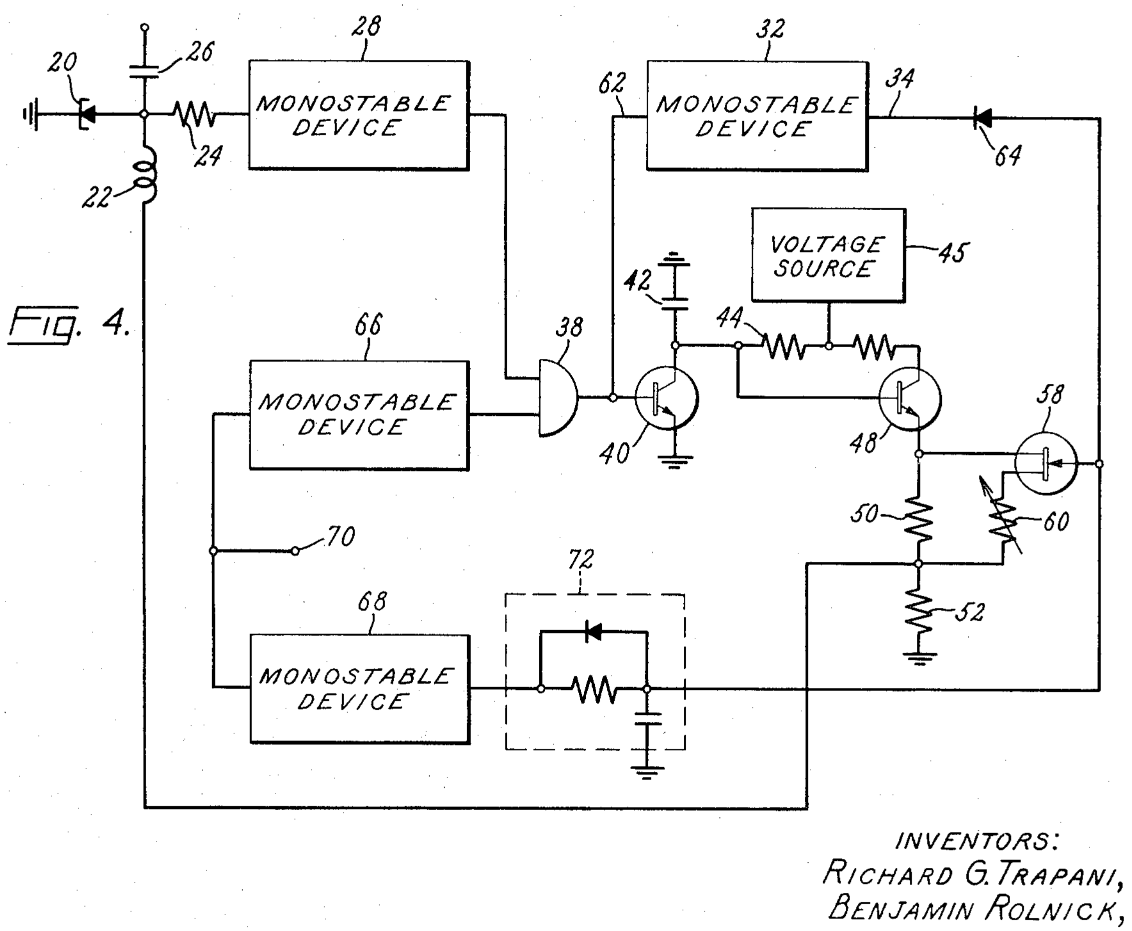
FIG. 4 represents schematically a circuit diagram embodying our invention controlled by an external source of timing pulses.

FIG. 4 represents schematically an embodiment of our invention whose functions are controlled by an external source of timing pulses. It was actually conceived for use in an infrared range measuring device, essentially a pulsed device similar in principle to a radar system. The function of monostable device 28 is essentially the same as in FIG. 2, but its triggered output is gated by gate 38, not with a signal from monostable device 34, but with an output from monostable device 66 which, together with another monostable device 68, receives a triggering pulse via terminal 70 from some source that generates such a pulse approximately coincidentally with the generation of a laser pulse. Device 66, when so triggered (i.e., in its unstable condition) disables gate 38 for a period of time during which significant signals (reflections of laser light from targets at various ranges) may be received; then, at the end of that period, it enables gate 38 so that any pulses which trigger device 28 will cause its unstable output to be fed to transistor 40, to drain capacitor 42, and to lead 62 trigger monostable device 32 and cause a depression in the bias applied to diode 20, to insure its being depressed temporarily below the turn-off value. A diode 64 is used to couple device 32 to FET 58 because the output of monostable device 68 is also coupled to FET 58. Monostable device 68, triggered from the same signal to terminal 70 which triggered device 66, provides an output at the time of such triggering which is connected to reduce the conduction through FET 58 and so to reduce the bias voltage on diode 20. This insures that the strong signal which will be fed to diode 20 at the time of pulsing of the laser (from internal reflections in the apparatus and nearby objects) will be markedly attenuated. However, because a laser ranging device has a sensitivity which is inversely proportional to the square of the range (for ordinarily diffusing targets), it is desirable to increase the sensitivity of the receiving system slowly, according to the square of the time after the laser pulse. Network 72 represents schematically a time-constant network which will vary according to the particular sensitivity characteristic required whose general function is to cause the bias on diode 20 to recover its maximum value (corresponding to maximum sensitivity) slowly even after the pulse from device 68 has ceased. The net effect of this embodiment, as distinguished from that of FIG. 2, is to stop the continuing readjustment of bias on diode 20 by operation of transistor 40 during the period when significant signals are received, and to permit it at other times; and to provide means for adjusting the sensitivity of the receiving system as a function of time during the period when significant signals may be received. In so doing, it is timed by signals external to itself, which appear at terminal 70.

What is claimed and desired to be secured by Letters Patent of the United States is:

1. Means for automatically adjusting the bias potential applied to a tunnel diode comprising:

a. a tunnel diode (20);

b. coupling means (26) for coupling an externally supplied triggering signal to the tunnel diode;

c. a first monostable device (28) connected (30) to receive from the tunnel diode an output pulse produced by the turning on of the tunnel diode and responsively thereto to produce a first output signal of first duration;

d. a second monostable device (32) connected to receive from the first monostable device the said first output and, responsively to the termination of the said first output, to produce a second output (36) of second duration greater than the first duration; and, at the termination of the second output, to produce a third output (34) enduring until it again is caused to produce a second output;

e. gating means (38) connected to receive the first and second outputs and, responsively to the simultaneous reception of both said outputs, to produce as an output a drain control signal;

f. a source of potential (45) higher than the turn-on potential of the diode connected to a first terminal of g. potential dropping means (44) connected to h. charge storage means (42), whose terminal potential is an increasing function of stored charge;

i. drain means (40) connected to receive the said drain control signal and, responsively thereto to drain charge from the said charge storage means;

j. potential follower means (46, 48) so connected to the charge storage means that, responsively to the terminal potential thereof, it applies to k. potential divider means (50, 52, 56, 58, 60) a potential proportional to the potential of the charge storage means, the said potential divider means being connected (22) to the tunnel diode to apply to the tunnel diode a potential which is a determinate fraction of the potential applied to the potential divider means; the said potential divider means comprising l. turn-off means (56, 58, 60) connected to the second monostable device to decrease the said determinate fraction during the existence of the said second output to a value such that the potential applied to the tunnel diode is reduced below its turn-off value.

* * * * *